United States Patent [19]

Fujii et al.

[11] Patent Number: 4,852,110
[45] Date of Patent: Jul. 25, 1989

[54] SEMICONDUCTOR LASER OF A REFRACTIVE INDEX-GUIDED TYPE AND A PROCESS FOR FABRICATING THE SAME

[75] Inventors: Hiroaki Fujii; Kenichi Kobayashi, both of Tokyo, Japan

[73] Assignee: NEC Corporation, Tokyo, Japan

[21] Appl. No.: 225,454

[22] Filed: Jul. 28, 1988

[30] Foreign Application Priority Data

Jul. 28, 1987 [JP] Japan .................................. 62-189839

[51] Int. Cl.$^4$ .............................................. H01S 3/19
[52] U.S. Cl. ........................................ 372/44; 372/45; 372/46
[58] Field of Search ............................... 372/44, 45, 46

[56] References Cited

U.S. PATENT DOCUMENTS

| | | | |
|---|---|---|---|
| 4,523,318 | 6/1985 | Connolly et al. | 372/44 |
| 4,674,094 | 6/1987 | Murakami | 372/45 |
| 4,680,768 | 7/1987 | Yagi | 372/44 |
| 4,737,961 | 4/1988 | Mori et al. | 372/44 |
| 4,757,509 | 7/1988 | Isshiki et al. | 372/45 |
| 4,779,281 | 10/1988 | Naka et al. | 372/45 |

*Primary Examiner*—William L. Sikes
*Assistant Examiner*—Robert E. Wise
*Attorney, Agent, or Firm*—Sughrue, Mion, Zinn, Macpeak & Seas

[57] ABSTRACT

A semiconductor laser of a refractive index-guided type comprises a GaAs (100) substrate having a mesa of (011) orientation thereon, a buffer layer grown on the top surface and side walls of the mesa of the GaAs (100) substrate and having a mesa on the top surface, a first cladding layer grown on the buffer layer in compliance with the outline on the top surface of the buffer layer having the mesa so that a mesa is provided, an active layer grown on the first cladding layer and separated on the side walls of the mesa of the first cladding layer, and a second cladding layer grown on the active layer, a boundary surface of which is in contact through a separated portion of the active layer with a boundary surface of the first cladding layer, wherein the first and second cladding layer are of a semiconductor material selected from AlGaInP and AlInP, and of a forbidden energy bandgap larger than that of the active layer. The semiconductor laser as described above is fabricated by a single etching process and a single and common metalorganic vapor phase epitaxy.

3 Claims, 4 Drawing Sheets

FIG. I
PRIOR ART
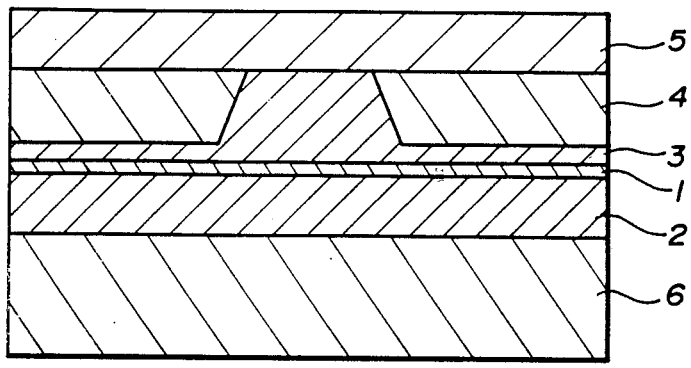
FIG. 2
PRIOR ART
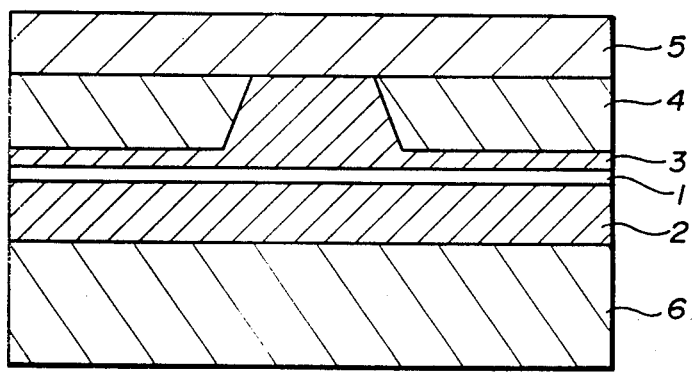

SEMICONDUCTOR LASER OF A REFRACTIVE INDEX-GUIDED TYPE AND A PROCESS FOR FABRICATING THE SAME

FIELD OF THE INVENTION

The invention relates to a semiconductor laser of a refractive index-guided type and a process for fabricating the same, and more particularly to a semiconductor laser of a refractive index-guided type which is applied to an optical information processing system, an optical communication system, a physical measurement system etc. and process for fabricating the same by which a semiconductor laser of a refractive index-guided type with an improved quality, a high reliability and a good transverse mode controllable property is fabricated.

BACKGROUND OF THE INVENTION

It was reported that a room temperature continuous-wave operation of a GaInP/AlGaInP semiconductor laser was realized at a 0.68 μm band. Since then, a development of the semiconductor laser has been intensively promoted, and a life of several thousands hours was confirmed to increase a reliability so that a possibility of practical use thereof is sharply increased. In expectation of improved properties of the semiconductor laser, it will be demanded in many fields such as an optical information processing means including a compact disk, an optical disk, a video disk, POS etc., and an optical communication or physical measurement system including an optical fiber. Simultaneously, it will be required that the semiconductor laser is improved even in a property of a transverse mode thereof. Especially, a semiconductor laser with a low noise property is demanded in a field of processing analog signal like a video disk, while a spectrum unity is required in a field of an optical communication system. In these respects, a semiconductor laser of a refractive index-guided type, for instance, a buried heterostructure is considered to be most pertinent as a transverse mode controllable structure to meet the aforementioned properties.

A structure of the GaInP/AlGaInP semiconductor laser which provides a high reliablity is of a gain-guided type including a mechanism for narrowing current therein, or of a loss-guided type including a semiconductor layer of a large absorption coefficient provided on side walls of a mesa as described later even if the latter is of a transverse mode controllable structure.

In such semiconductor lasers of gain-guided type or a loss-guided type, a spectra of a multi-mode oscillation are obtained to result in a degradation of S/N ratio. Therefore, it is considered that a feedback noise characteristic i badly affected as compared to a semiconductor laser of a refractive index-guided type in which a high frequency bias method is adopted. Further, astigmatism is large because a plane of guided wave is curved so that the increase of recording density is difficult on an optical disk. For these reasons, a semiconductor laser of a refractive index-guided type can be advantageously used for a transverse mode controllable structure which is applied to an optical information processing or communication system.

Therefore, a semiconductor laser of a refractive index-guided type will be mainly considered hereinafter. However, there is no report so far in which a GaInP/AlGaInP semiconductor laser of a refractive index-guided type is discussed as a tranverse mode controllable structure. For the reason, semiconductor lasers of three types which are easily conceived from a conventional GaAs/AlGaAs semiconductor laser of a refractive index-guided structure will be discussed, provided that a transverse mode controllable structure peculiar to a liquid phase epitaxy (LPE) process like a V-channeled substrate inner stripe laser, a channeled substrate planar laser etc. is not considered herein because GaInP/AlGaInP semiconductor material is not grown by the LPE process for the reason why a segregation constant of aluminum is very large so that the growth thereof is performed only by a metalorganic vapour phase epitaxy (MOVPE) process or a molecular beam epitaxy (MBE) process.

A first type is a semiconductor laser of a loss-guided type in which a current blocking layer is GaAs, and a cladding layer is partially thin to provide a mesa buried with the current blocking layer, and which is reported that a room temperature continuous oscillation is realized therein.

In the semiconducter laser, it is assumed that the current blocking layer is of AlGaInP or AlInP which is larger in a composition of aluminum than AlGaInP for the cladding layer having the mesa thereby providing a semiconductor laser of a refractive index-guided type.

In the assumed semiconducter laser, however, there is expected disadvantage that the fabrication of the semiconducter laser is not smoothly performed because lump polycrystal is percipated on a selective mask of, for instance, SiNx film in a case where the mesa is buried with AlGaInP or AlInP by a selective epitaxy of the MOVPE process wherein the percipation of the lump polycrystal is increased in proportional to a value of "X" in $(Al_XGa_{1-X})_YIn_{1-Y}P$.

A second type is a buried heterostructure laser of GaAs/AlGaAs which comprises a narrow active layer sandwiched by narrow cladding layers, and two current blocking layers grown on both side walls, and which is fabricated by a normal LPE process including at least two separate steps.

In the buried heterostructure laser, there is expected a disadvantage that an incomplete growth of the current blocking layers is resulted on both side walls of the active layer and the cladding layers to decrease a reliability thereof in a case where the current blocking layers ar of AlGaInP crystal because both side walls of the active layer and the cladding layers are exposed to the atmosphere and the crystal is very sensitive to a contamination of $O_2$. Further, leakage current tends to flow when boundary surfaces of the current blocking layers are deviated from the active layer.

A third type is a semiconductor laser of a self-aligned type which is fabricated by a normal MOVPE process in a case where GaAs/AlGaAs semiconducter materials are used therein. The semiconductor laser is assumed that a current blocking layer is of AlGaInP or AlInP which is larger in composition of aluminum than that of AlGaInP for cladding layers in a current injecting region to provide a real refractive index difference.

In the assumed semiconductor laser, there are expected disadvantages that a cladding layer is grown incompletely in a second MOVPE process on a first MOVPE-grown cladding layer, and a crystal quality thereof is degraded because the current blocking layer grown on the cladding layer by a first MOVPE process is provided with an aperture to expose a portion of the atmosphere thereby resulting in an oxidation thereof, and cladding and cap layers are then grown thereon by a second MOVPE process, and that a resistance of boundary surfaces between the cladding layers is increased for the same reason described above. Further, a deterioration of the semiconductor laser is promoted to decrease a reliability for the reason why light density is high at the boundary surfaces and current is flowed therethrough because the boundary surfaces are very near the active layer.

SUMMARY OF THE INVENTION

Accordingly, it is an object of the invention to provide a semiconducter laser of a refractive index-guided type and a process for fabricating the same in which a semiconducter laser of a refractive index-guided type is fabricated without a specific problem such as the percipation of lump polycrystal.

It is a further object of the invention to provide a semiconducter laser of a refractive index-guided type and a process for fabricating the same in which an incomplete growth of a layer is not occurred.

It is a still further object of the invention to provide a semiconducter laser of a refractive index-guided type and a process for fabricating the same in which a degradation of crystal quality is not induced in a layer.

It is a yet still further object of the invention to provide a semiconducter laser of a refractive index-guided type and a process for fabricating the same in which a semiconducter laser of a refractive index-guided type is fabricated by a single MOVPE process thereby providing an easy fabrication property, a high reliability, and a high process tolerance.

According to a feature of the invention, a semiconducter laser of a refractive index-guided type comprises, a GaAs (100) substrate having a mesa of (011) orientation thereon, a buffer layer grown on the top surface and side walls of said mesa of GaAs (100) substrate, said buffer layer having a mesa on said top surface, a first cladding layer grown on said buffer layer in compliance with the outline on the top surface of said buffer layer having said mesa thereby having mesa, an active layer grown on said first cladding layer, said active layer being separated on side walls of mesa of said first cladding layer, and a second cladding layer grown on said active layer, a boundary surface of said second cladding layer being in contact through a separated portion of said active layer with a boundary surface of said first cladding layer, wherein said first and second cladding layers are of a semiconductor material selected from AlGaInP and AlInP, and of a forbidden energy bandgap larger than that of said active layer.

According to a further feature of the invention, a process for fabricating a semiconductor laser of a refractive index-guided type comprises steps of, etching a GaAs (100) substrate to provide a mesa of (011) orientation, growing a buffer layer of GaAs on said substrate provided with said mesa to provide a mesa thereon by a metalorganic vapour phase epitaxy, growing a first cladding layer of a semiconductor material selected from AlGaInP and AlInP on said buffer layer provided with said mesa in compliance with the outline on the upper surface of said buffer layer by the metalorgnic vapour phase epitaxy, growing an active layer of GaInP having a forbidden energy bandgap less than that of said first cladding layer on said first cladding layer by the metalorgnic vapour phase epitaxy, said active layer being separated on side walls of mesa of said first cladding layer, and growing a second cladding layer of a semiconductor material selected from AlGaInP and AlInP having a forbidden energy bandgap larger than that of said active layer on said active layer by the metalorganic vapour phase epitaxy, a boundary surface of said second cladding layer being in contact through a separated portion of said active layer with a boundary surface of said first

BRIEF DESCRIPTION OF THE DRAWINGS

The invention will be explained in more detail in conjunction with appended drawings wherein, FIG. 1 is a cross sectional view showing a conventional semiconductor laser of a loss-guided type, FIGS. 2 to 4 are cross sectional views showing a conventional semiconductor laser of a refractive index-guided type.

DESCRIPTION OF PREFERRED EMBODIMENTS

Figure 3:
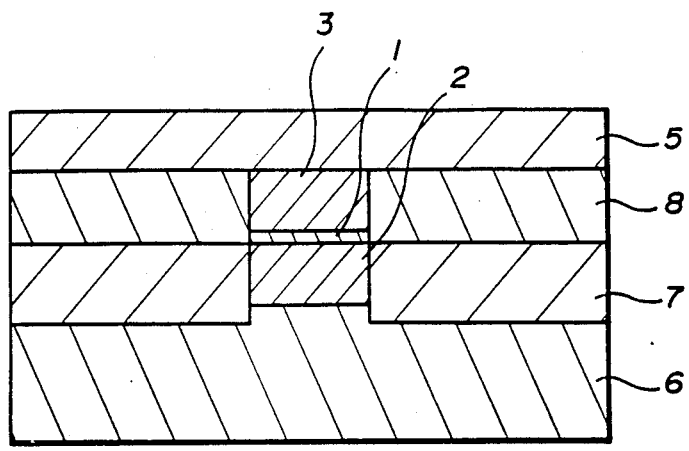

Before describing a semiconductor laser of a refractive index-guided type in an embodiment according to the invention, the aforementioned semiconductor laser of a loss-guided type including semiconductor laser of a large absorption coefficient provided on side wall of a mesa, and the aforementioned first to third semiconductor laser of a refractive index-guided type are briefly explained again in conjunction with FIGS. 1 to 4.

FIG. 1 shows the semiconductor laser of a loss-guided type which comprises an active layer 1, cladding layers 2 and 3 for sandwiching the active layer 1, a current blocking layer 4 of GaAs provided on side walls of a mesa of the cladding layer 3, a cap layer 5 on the top surface of which an electrode is provided, and a substrate of GaAs on the back surface of which the other electrode is provided. In the semiconductor laser, the current blocking layer 4 is of a semiconductor layer of a large absorption coefficient as described above.

FIG. 2 shows the aforementioned semiconductor laser of the first type which comprises a active layer 1, cladding layers 2 and 3, a current blocking layer 4, a cap layer 5, and a substrate 6 wherein the cladding layer 3 is partially thin to provide a mesa which is buried with the current blocking layer 4 of the same conduction type as that of the substrate 6. The semiconductor laser is of a loss-guided type in which the current blocking layer 4 is GaAs and is reported that a room temperature continuous-wave oscillation is realized therein.

In the semiconductor laser, it is assumed that the current blocking layer 4 is AlGaInP or AlInP which is larger in a composition of aluminum than AlGaInP for the cladding layer 3 having the mesa thereby providing a semiconducter laser of a refractive index-guided type.

In the assumed semiconductor laser, however, there is expected the aforementioned disadvantage because lump polycrystal is percipated on a selective mask of, for instance, SiNx film in a case where the mesa is buried with AlGaInP or AlInP by a selective epitaxy of the MOVPE process wherein the percipation of the lump polycrystal is increased in proportional to a value of "X" in $(Al_XGa_{1-X})_YIn_{1-Y}P$.

FIG. 3 shows the aforementioned buried heterostructure laser of the second type which is fabricated by a normal LPE process in a case where GaAs/AlGaAs semiconductors are used therein and which comprises an active layer 1, cladding layers 2 and 3, a cap layer 5, a substrate 6, and current blocking layers 7 and 8.

In the buried heterostrure laser, there is expected a disadvantage that an incomplete growth of the layers 7 and 8 is resulted to decrease a reliability in a case where the current blocking layers 7 and 8 are of AlGaInP crystal because both side walls of the active layer 1 and the cladding layers 2 and 3 are exposed to the atmosphere and the crystal is very sensitive to a contamination of $O_2$. Further, leakage current tends to flow when boundary surfaces of the current blocking layers 7 and 8 are deviated from the active layer 1.

Figure 4:
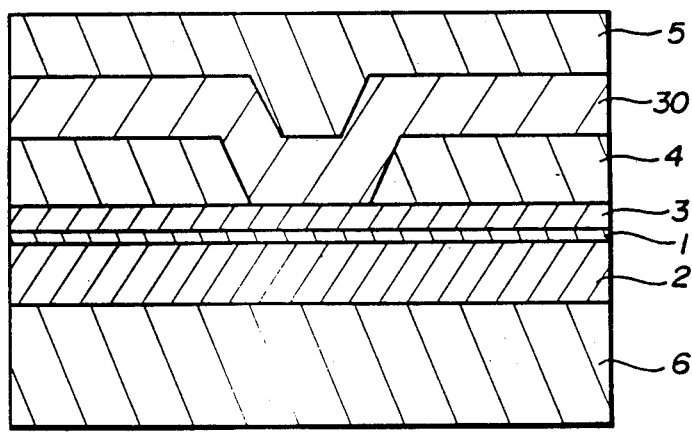

FIG. 4 shows the aforementioned third semiconductor laser of a self-aligned type which is fabricated by a normal MOVPE process in a case where GaAs/AlGaAs semiconductors are used therein. The semiconductor laser comprises an active layer 1, cladding layers 2, 3 and 30, a current blocking layer 4, a cap layer 5, and a substrate 6, and is assumed that the current blocking layer 4 is of AlGaInP or AlInP which is larger in a composition of aluminum than that of AlGaInP for cladding layers 3 and 30 to provide a real refractive index difference.

In the assumed semiconductor laser, there are expected the aforementioned disadvantages.

Figure 5:
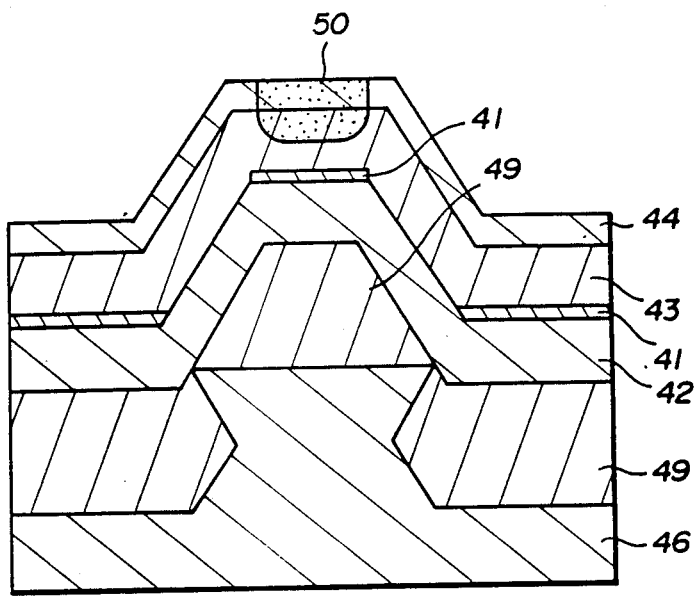
FIG. 5 is a cross sectional view showing a semiconductor laser of a refractive index-guided type in an embodiment according to the invention.

Next, a semiconductor laser of a refractive index-guided type and a process for fabricating the same in the embodiment according to the invention will be explained in FIG. 5 and FIGS. 6A to 6E wherein FIG. 5 shows a semiconductor laser of a refractive index-guided type in the embodiment, and FIGS. 6A to 6E show the process for fabricating the same in the embodiment.

The semiconductor laser of a refractive index-guided type will be understood from following explanations of the process for fabricating the same.

Figure 6A:
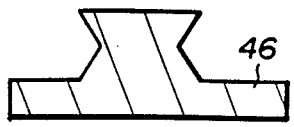
FIGS. 6A to 6E are cross sectional views showing a process for fabricating a semiconductor laser of a refractive index-guided type according to the invention.
Figure 6D:
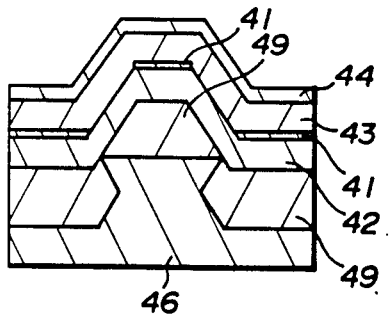
Figure 6B:
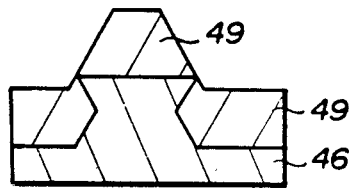
Figure 6E:
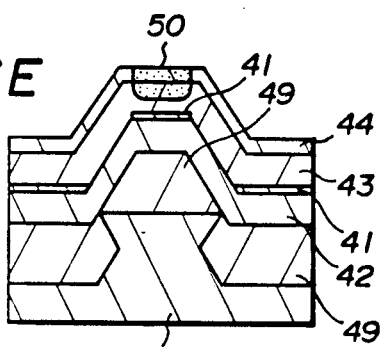
Figure 6C:
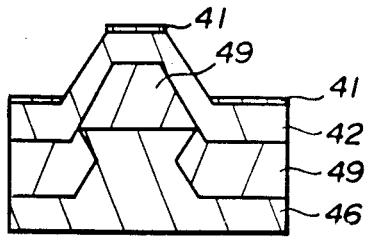

First of all, an n-GaAs (100) substrate 46 doped with Si is etched to provide a mesa of (011) orientation which is generally called "a reverse mesa" by use of etchant composed of $H_2$, $H_2O_2$ and $H_2O$. The height of the mesa is 3.0 μm (FIG. 6A). Next, a buffer layer 49 of GaAs doped with Se is grown on the mesa to have a thickness of 2.5 μm by a MOVPE process (FIG. 6B). The growth of the buffer layer 49 preserves (111) B plane on the side wall of the mesa and is finally finished to be of a triangle shape thereby providing an additional mesa as reported on page 160 of a proceeding 27P-T-14 for the meeting of "Japan Society of Applied Physics" Autumn, 1986. This is presumed that the (111) B plane is a non-growth plane of a very low growth rate in a case where GaAs/AlGaAs is grown by a MOVPE process. Then, a cladding layer 42 of AlGaInP or AlInP, for instance, $(Al_{0.4}Ga_{0.6})_{0.5}In_{0.5}P$ doped with Se having a thickness of 1.0 μm, an active layer 41 of GaInP, for instance, non-doped $Ga_{0.5}In_{0.5}P$ having a thickness of 0.1 μm, a cladding layer 43 of AlGaInP or AlInP, for instance, $(Al_{0.4}Ga_{0.6})_{0.5}In_{0.5}P$ doped with Zn having a thickness of 1.0 μm, and a current blocking layer 44 of GaAs doped with Se having a thickness of 0.5 μm and of the same conduction type as the substrate 46 are successively grown on the buffer layer 49 to provide a double heterostructure by the common MOVPE process to the buffer layer 49 (FIGS. 6C and 6D). Finally, Zn is diffused through the current blocking layer 44 into the cladding layer 43 to provide a Zn-diffused region 50 which is a current injecting portion (FIG. 6E) A forbidden energy bandgap of the active layer 41 is less than those of cladding layers 42 and 43.

At the stage of growing the cladding layers 42 and 43 of AlGaInP or AlInP, mesa side walls of (111) B plane are grown with the approximately same growth rate as mesa top and bottom planes of (100) plane. This is quite different from a phenomenon of GaAs/AlGaAs in which the growth of side walls is commenced to be risen from the bottom plane of the mesa and is deviated from (111) B plane to some extent.

On the other hand, the inventors confirmed in their experiment that the active layer 41 of GaInP is grown with an extremely low rate on (111) B plane or a high index plane deviated from (111) B plane by less than several degrees as compared to the growth on (100) plane. This is presumed that the same mechanism as a mechanism in which GaAs is extremely difficult to be grown on (111) B plane functions in GaInP.

Accordingly, the buffer layer 49 of GaAs is first grown on the substrate 46 to provide the mesa having (111) B plane on the side walls, and a double heterostructure including the active layer 41 of GaInP is grown so that a semiconductor laser of a buried heterostructure in which the GaInP active layer 41 is buried with the cladding layer 42 and 43 of AlGaInP or AlInP can be fabricated. In the semiconductor laser of the refractive index-guided type according to the invention, it is not necessary to expect the growth rising from the bottom plane because the side walls of the active layer 41 are buried.

The advantageous feature of the invention is that a semiconductor laser of the refractive index-guided type is fabricated by a single MOVPE growth by utilizing a characteristic in a MOVPE growth of GaInP/AlGaInP semiconductor material. For the reason, AlGaInP or AlInP including Al of a high composition is not exposed to the atmosphere so that an oxidation of AlGaInP or AlInP can be avoided thereby providing AlGaInP semiconductor crystal of a high quality, although such an oxidation is a serious disadvantage in the conventional semiconductor laser as shown in FIGS. 2 to 4. As a result, a semiconductor laser of a refractive index-guided type can be provided in the invention. Further, no etching is performed after the growth of a double heterostructure so that it is not necessary to control a thickness of a grown film or a depth of etching in a high precision. This provides the increase of a tolerance in a fabricating process.

Although the invention has been described with respect to specific embodiment for complete and clear disclosure, the appended claims are not to thus limited but are to be construed as embodying all modification and alternative construction that may occur to one skilled in the art which fairly fall within the basic teaching set forth herein.

What is claimed is:

1. A semiconducter laser of a refractive index-guided type comprising,
   a GaAs (100) substrate having a mesa of (011) orientation thereon,
   a buffer layer grown on the top surface and side walls of said mesa of GaAs (100) substrate, said buffer layer having a mesa on said top surface, a first cladding layer grown on said buffer layer in compliance with the outline on the top surface of said buffer layer having said mesa thereby having a mesa, an active layer grown on said first cladding layer, said active layer being separated on side walls of said mesa of said first cladding layer, and a second cladding layer grown on said active layer, a boundary surface of said second cladding layer being in contact through a separated portion of said active layer with a boundary surface of said first cladding layer, wherein said first and second cladding layers are of a semiconductor material selected from AlGaInP and AlInP, and of a forbidden energy bandgap larger than that of said active layer.

2. A semiconductor laser of a refractive index-guided type according to claim 1, wherein a metal is diffused into said second cladding layer to provide a current injecting region.

3. A process for fabricating a semiconductor laser of a refractive index-guided type comprising steps of, etching a GaAs (100) substrate to provide a mesa of (011) orientation, growing a buffer layer of GaAs on said substrate provided with said mesa to provide a mesa thereon by a metalorganic vapour phase epitaxy, growing a first cladding layer of a semiconductor material selected from AlGaInP and AlInP on said buffer layer provided with said mesa in compliance with the outline on the upper surface of said buffer layer by the metalorganic vapour phase epitaxy, growing an active layer of GaInP having a forbidden energy bandgap less than that of said first cladding layer on said first cladding layer by the metalorganic vapour phase epitaxy, said active layer being separated on side walls of a mesa of said first cladding layer, and growing a second cladding layer of a semiconductor material selected from AlGaInP and AlInP having a forbidden energy bandgap larger than that of said active layer on said active layer by the metalorganic vapour phase epitaxy, a boundary surface of said second cladding layer being in contact through a separated portion of said active layer with a boundary surface of said first cladding layer.

* * * * *

UNITED STATES PATENT AND TRADEMARK OFFICE
CERTIFICATE OF CORRECTION

PATENT NO. : 4,852,110

DATED : July 25, 1989

INVENTOR(S) : Fujii et al

It is certified that error appears in the above-identified patent and that said Letters Patent is hereby corrected as shown below:

Column 1, line 53, delete "i" and insert --is--.

Column 2, line 46, delete "ar" and insert --are--.

Column 4, line 10, after "first" insert --cladding layer.--.

Signed and Sealed this

Twenty-fourth Day of July, 1990

Attest:

HARRY F. MANBECK, JR.

Attesting Officer   Commissioner of Patents and Trademarks